United States Patent
Fujita et al.

(10) Patent No.: US 8,483,359 B2
(45) Date of Patent: Jul. 9, 2013

(54) SOLID IMAGING DEVICE AND X-RAY CT DEVICE INCLUDING THE SOLID IMAGING DEVICE

(75) Inventors: Kazuki Fujita, Hamamatsu (JP); Harumichi Mori, Shizuoka (JP); Ryuji Kyushima, Hamamatsu (JP); Masahiko Honda, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 170 days.

(21) Appl. No.: 12/864,736

(22) PCT Filed: Jan. 22, 2009

(86) PCT No.: PCT/JP2009/050984
§ 371 (c)(1),
(2), (4) Date: Jul. 27, 2010

(87) PCT Pub. No.: WO2009/096313
PCT Pub. Date: Aug. 6, 2009

(65) Prior Publication Data
US 2010/0316185 A1    Dec. 16, 2010

(30) Foreign Application Priority Data
Jan. 30, 2008    (JP) .................................. P2008-019340

(51) Int. Cl.
*H05G 1/64*    (2006.01)
(52) U.S. Cl.
USPC .................. 378/98.8; 378/19; 250/370.09
(58) Field of Classification Search
USPC .................. 378/19, 98.8; 250/370.09
See application file for complete search history.

(56) References Cited

U.S. PATENT DOCUMENTS

| 5,144,447 | A  | * | 9/1992 | Akimoto et al. | ............... | 348/301 |
| 5,912,465 | A  | * | 6/1999 | Kobayashi et al. | ...... | 250/370.09 |
| 6,185,274 | B1 |   | 2/2001 | Kinno et al. | | |
| 6,435,714 | B1 | * | 8/2002 | Bruder | .......................... | 378/196 |
| 6,437,767 | B1 | * | 8/2002 | Cairns et al. | .................. | 345/100 |
| 6,470,071 | B1 | * | 10/2002 | Baertsch et al. | ................ | 378/62 |
| 6,593,577 | B2 | * | 7/2003 | Izumi | ....................... | 250/370.09 |
| 6,718,010 | B2 | * | 4/2004 | Petrick et al. | ................ | 378/98.8 |

(Continued)

FOREIGN PATENT DOCUMENTS

| JP | 1-120970 | 5/1989 |
| JP | H7-322141 | 12/1995 |

(Continued)

*Primary Examiner* — Allen C. Ho
(74) *Attorney, Agent, or Firm* — Drinker Biddle & Reath LLP

(57) ABSTRACT

The present invention relates to a solid-state imaging device, etc. having a structure for capturing a high-resolution image even when any row selecting wiring is disconnected. The solid-state imaging device (1) comprises a photodetecting section (10), a signal reading-out section (20), a row selecting section (30), a column selecting section (40), an overflow preventing section (50), and a controlling section (60). The photodetecting section (10) has M×N pixel portions $P_{1,1}$ to $P_{M,N}$ two-dimensionally arranged in a matrix of M rows and N columns, and each of the pixel portions $P_{1,1}$ to $P_{M,N}$ includes a photodiode that generates charge of an amount according to an incident light intensity and a reading-out switch connected to the photodiode. Each of the N pixel portions $P_{m,1}$ to $P_{m,N}$ belonging to an m-th row is connected to the row selecting section (30) and the overflow preventing section (50) by an m-th row selecting wiring $L_{V,m}$.

8 Claims, 7 Drawing Sheets

U.S. PATENT DOCUMENTS

| | | | | |
|---|---|---|---|---|
| 6,798,453 B1 * | 9/2004 | Kaifu | ............................ | 348/304 |
| 6,930,310 B2 * | 8/2005 | Moon | ...................... | 250/370.09 |
| 6,961,088 B2 * | 11/2005 | Kameshima et al. | ......... | 348/303 |
| 7,119,341 B2 * | 10/2006 | Petrick | .................... | 250/370.09 |
| 7,223,980 B2 * | 5/2007 | Tanaka et al. | ............ | 250/370.09 |
| 7,435,968 B2 * | 10/2008 | Watanabe et al. | ........ | 250/370.14 |
| 7,488,948 B2 * | 2/2009 | Ishii et al. | ................. | 250/370.11 |
| 7,839,977 B2 * | 11/2010 | Kameshima et al. | ......... | 378/116 |
| 2001/0033336 A1 | 10/2001 | Kameshima et al. | | |
| 2002/0017666 A1 | 2/2002 | Ishii et al. | | |
| 2005/0242380 A1 | 11/2005 | Suzuki et al. | | |

FOREIGN PATENT DOCUMENTS

| | | |
|---|---|---|
| JP | H9-252104 | 9/1997 |
| JP | 2001-251557 | 9/2001 |
| JP | 2005-000573 | 1/2005 |
| JP | 2006-234557 | 9/2006 |
| JP | 2007-68014 | 3/2007 |

* cited by examiner

SOLID IMAGING DEVICE AND X-RAY CT DEVICE INCLUDING THE SOLID IMAGING DEVICE

TECHNICAL FIELD

The present invention relates to a solid-state imaging device with a plurality of photodetecting sections arranged two-dimensionally, and an X-ray CT apparatus including the same. The controlling is closed.

BACKGROUND ART

As a solid-state imaging device, those using the CMOS technique are known, and among these, a passive pixel sensor (PPS) type solid-state imaging device is known (see Patent Document 1). The PPS type solid-state imaging device has a structure where PPS type pixel portions including photodiodes for generating charges of amounts according to incident light intensities are two-dimensionally arrayed in M rows and N columns. In each pixel portion, charges generated in the photodiode in response to light incidence are accumulated in a capacitive element of an integrating circuit, and a voltage value according to the accumulated charge amount is output.

In general, an output terminal of each of the M pixel portions belonging to each column is connected to an input terminal of an integrating circuit provided corresponding to the column via a reading-out wiring provided corresponding to the column. And, in order from the first row to the M-th row, a charge generated in the photodiode of the pixel portion is inputted to a corresponding integrating circuit through a corresponding reading-out wiring, and a voltage value according to the charge amount is outputted from the integrating circuit.

Moreover, each of the N pixel portions belonging to each row is connected to a controlling section via a row selecting wiring provided corresponding to the row. In accordance with a row selecting controlling signal transmitted from the controlling section via the row selecting wiring, each pixel portion outputs a charge generated in the photodiode to the reading-out wiring.

The PPS type solid-state imaging device is used for various purposes. For example, the PPS type solid-state imaging device is used in combination with a scintillator panel as an X-ray flat panel also for medical purposes and industrial purposes. Further, the PPS type solid-state imaging device is also used, specifically, in an X-ray CT apparatus, a microfocus X-ray inspection system, etc. The solid-state imaging device to be used for these purposes has a large-area photodetecting section in which M×N pixel portions are two-dimensionally arrayed, and the photodetecting section may be integrated on a semiconductor substrate having a size with sides more than 10 centimeters in length. Therefore, only one solid-state imaging device may be produced from one semiconductor wafer.

Patent Document 1: Japanese Laid-Open Patent Application No. 2006-234557

DISCLOSURE OF THE INVENTION

Problems that the Invention is to Solve

The present inventors have examined the conventional solid-state imaging device, and as a result, have discovered the following problems. That is, in the conventional solid-state imaging device, when a row selecting wiring corresponding to any one of the rows is disconnected during production, pixel portions located closer to the row selecting section than the disconnected point among the N pixel portions of the row are connected to the row selecting section by the row selecting wiring, while pixel portions located farther from the row selecting section than the disconnected point are not connected to the row selecting section.

More specifically, in the conventional solid-state imaging device, charges generated in photodiodes in response to light incidence in the pixel portions located farther from the row selecting section than the disconnected point are not reading-out to the integrating circuit, and are just accumulated in junction capacitance portions of the photodiodes. When the amount of charges accumulated in the junction capacitance portions of the photodiodes exceeds a saturation level, a surplus of charges over the saturation level overflows to the neighboring pixel portions.

Therefore, in the conventional solid-state imaging device, when one row selecting wiring is disconnected, this influences not only the pixel portions of the row connected to the row selecting wiring but also pixel portions of neighboring rows on both sides of the row in question, and eventually, defective lines occur with pixel portions of three consecutive rows.

On the other hand, when defective lines are not consecutive and the neighboring lines of one defective line are normal, pixel data of the defective line can be interpolated by using pixel data of the normal neighboring lines. However, when defective lines occur with pixel portions of three consecutive rows, the above-described interpolation is difficult. Particularly, in the solid-state imaging device having a large-area photodetecting section as described above, the probability of disconnection occurring is greater due to a long length of the row selecting wiring.

There has been proposed in Patent Document 1 a technique with the intention of eliminating such problems. More specifically, in the technique proposed in the above Patent Document 1, an average value of all pixel data of a neighboring line neighboring the defective line and an average value of all pixel data of a few further neighboring normal lines are obtained. It is determined that the neighboring line is also defective if a difference between these average values is not less than a predetermined value, the pixel data of the neighboring line is corrected, and further pixel data of the defective line is corrected based on a value after correction of the pixel data of the neighboring line.

In the technique proposed in Patent Document 1, when correcting the pixel data of the neighboring line determined to be defective, an average value of two pieces of pixel data on the nearest normal lines on both sides of the neighboring line is determined, the average value is set as pixel data of the neighboring line. Moreover, when correcting the pixel data of the defective line, an average value of two pieces of pixel data on the neighboring lines on both sides of the defective line is determined, the average value is set as pixel data of the defective line.

However, in the technique proposed in Patent Document 1, since the process to determine an average of two pieces of pixel data is to be repeated a plurality of times in order to correct pixel data of a defective line (and a line determined to be defective present in the vicinity of the defective line), an image after correction has a low resolution in the vicinity of the defective line.

The present invention has been developed to eliminate the problems described above. It is an object of the present invention to provide a solid-state imager having a structure for allowing capturing a high-resolution image even when any row selecting wiring is disconnected and an X-ray CT apparatus including the same.

Means for Solving the Problems

A solid-state imaging device according to the present invention comprises: a photodetecting section having M (an integer not less than 2)×N (an integer not less than 2) pixel portions $P_{1,1}$ to $P_{M,N}$ two-dimensionally arrayed so as to form a matrix of M rows and N columns; a reading-out wiring $L_{O,n}$ connected to a reading-out switch included in each of the M pixel portions $P_{1,n}$ to $P_{M,n}$ belonging to an n-th (an integer not less than 1 and not more than N) column in the photodetecting section; a signal reading-out section connected to each of the reading-out wirings $L_{O,1}$ to $L_{O,N}$; a row selecting wiring $L_{V,m}$ connected to the reading-out switch included in each of the N pixel portions $P_{m,1}$ to $P_{m,N}$ belonging to an m-th row in the photodetecting section; a row selecting section connected to one end of each of the row selecting wirings $L_{V,1}$ to $L_{V,M}$; and an overflow preventing section connected to the other end of each of the row selecting wirings $L_{V,1}$ to $L_{V,M}$.

Each of the pixel portions $P_{1,1}$ to $P_{M,N}$ constituting the photodetecting section includes a photodiode that generates charge of an amount according to an incident light intensity and a reading-out switch connected to the photodiode. The reading-out wiring $L_{O,n}$ reads out a charge generated in the photodiode included in any one of the M pixel portions $P_{1,n}$ to $P_{M,n}$ via the associated reading-out switch. The signal reading-out section once holds a voltage value according to an amount of charge inputted through the reading-out wiring $L_{O,n}$, and then sequentially outputs the held voltage values. The row selecting wiring $L_{V,m}$ transmits a signal to control an opening and closing operation for reading-out switch to these reading-out switches. The row selecting section outputs a row selecting controlling signal to control an opening and closing operation of the reading-out switch included in each pixel portion $P_{m,n}$ of the photodetecting section to the row selecting wiring $L_{V,m}$, sequentially row by row, to close the reading-out switch in each pixel portion $P_{m,n}$ connected by the row selecting wiring, and thereby outputs a charge generated in a photodiode included in each pixel portion $P_{m,n}$ to the reading-out wiring $L_{O,n}$. The overflow preventing section outputs an overflow preventing signal to control an opening and closing operation of the reading-out switch included in each pixel portion $P_{m,n}$ of the photodetecting section to the row selecting wiring $L_{V,m}$ to close the reading-out switch in each pixel portion $P_{m,n}$ connected by the row selecting wiring, and thereby prevents a charge generated in the photodiode included in each pixel portion $P_{m,n}$ from overflowing outside the pixel portion.

In the solid-state imaging device according to the present invention, one end of each of the row selecting wirings $L_{V,1}$ to $L_{V,M}$ is connected to the row selecting section, and a row selecting controlling signal is inputted from the row selecting section. Moreover, the other end of each of the row selecting wirings $L_{V,1}$ to $L_{V,M}$ is connected to the overflow preventing section, and an overflow preventing signal is inputted from the overflow preventing section. Either of the row selecting controlling signal and overflow preventing signal is a signal to control an opening and closing operation of the reading-out switch included in each pixel portion of the photodetecting section. However, the row selecting controlling signal to be outputted from the row selecting section is a signal for reading out a charge from each pixel portion in the photodetecting section. In contrast thereto, the overflow preventing signal to be outputted from the overflow preventing section is a signal that is, when any one of the row selecting wirings is disconnected in the photodetecting section, by closing the reading-out switches in pixel portions located farther from the row selecting section than the disconnected point among the pixel portions to be connected to the disconnected row selecting wiring, for preventing charges generated in the photodiodes included in the pixel portions from overflowing outside the pixel portions.

In the solid-state imaging device according to the present invention, it is preferable that the overflow preventing section, when any one of the row selecting wirings $L_{V,1}$ to $L_{V,M}$ is disconnected, selectively outputs the overflow preventing signal to the disconnected row selecting wiring.

In the solid-state imaging device according to the present invention, it is preferable that the overflow preventing section, when any one of the row selecting wirings $L_{V,1}$ to $L_{V,M}$ is disconnected, outputs the overflow preventing signal to each of the disconnected row selecting wiring and row selecting wirings neighboring the disconnected row selecting wiring.

Further, in the solid-state imaging device according to the present invention, it is preferable that the overflow preventing section, when outputting the overflow preventing signal to any one of the row selecting wirings $L_{V,1}$ to $L_{V,M}$, outputs the overflow preventing signal at the same timing as that of outputting a row selecting controlling signal from the row selecting section to the row selecting wiring.

Moreover, an X-ray CT apparatus according to the present invention comprises: an X-ray output section; a solid-state imaging device having a structure as described above (solid-state imaging device according to the present invention); moving means; and an image analyzing section. The X-ray output section outputs X-rays toward a subject. The solid-state imaging device receives and images X-rays having been outputted from the X-ray output section and reached through the subject. Moving means moves the X-ray output section and the solid-state imaging device relative to the subject. The image analyzing section inputs frame data to be outputted from the solid-state imaging device, and generates a tomographic image of the subject based on the frame data.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the scope of the invention will be apparent to those skilled in the art from this detailed description.

Effects of the Invention

In accordance with the solid-state imaging device and the like according to the present invention, a high-resolution image can be captured even when any row selecting wiring is disconnected.

DESCRIPTION OF THE REFERENCE NUMERALS

Figure 1:
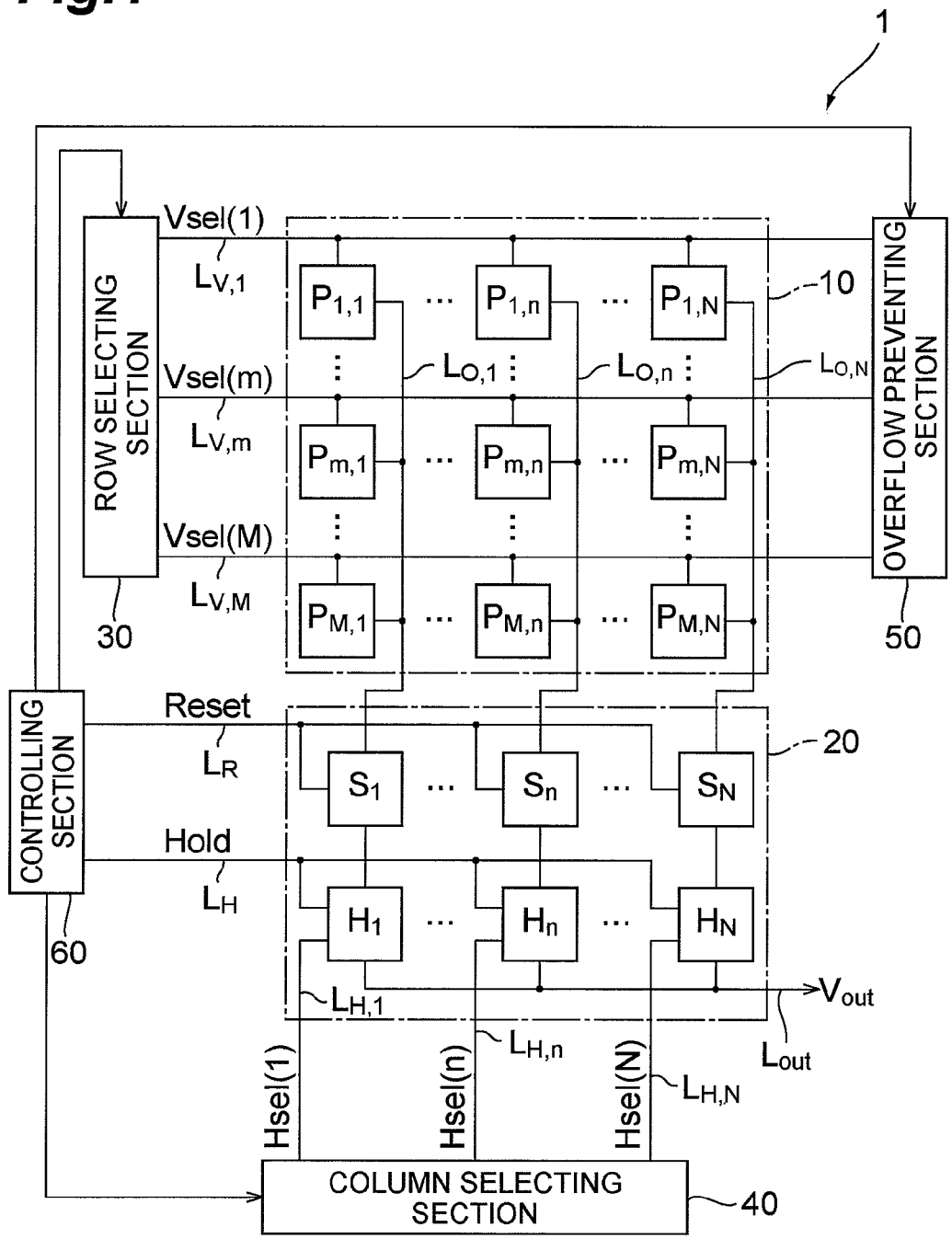
FIG. 1 is a view showing a configuration of an embodiment of a solid-state imaging device according to the present invention.

1 . . . solid-state imager; 10 . . . photodetecting section; 20 . . . signal reading-out section; 30 . . . row selecting section; 40 . . . column selecting section; 50 . . . overflow preventing section; 60 . . . controlling section; $P_{1,1}$ to $P_{M,N}$ . . . pixel portion; PD . . . photodiode; $SW_1$ . . . reading-out switch; $S_1$ to $S_N$ . . . integrating circuit; $C_2$ . . . integrating capacitive element; $SW_2$ . . . discharge switch; $A_2$ . . . amplifier; $H_1$ to $H_N$ . . . holding circuit; $C_3$ . . . holding capacitive element; $SW_{31}$ . . . input switch; $SW_{32}$ . . . output switch; $L_{V,m}$ . . . m-th row selecting wiring; $L_{H,n}$ . . . n-th column selecting wiring; $L_{O,n}$ . . . n-th column reading-out wiring; $L_R$ . . . discharge controlling wiring; $L_H$ . . . hold controlling wiring; and $L_{out}$ . . . voltage output wiring.

BEST MODES FOR CARRYING OUT THE INVENTION

In the following, embodiments of a solid-state imaging device and an X-ray CT apparatus according to the present invention will be explained in detail with reference to FIGS. 1 to 7. In the description of the drawings, identical or corresponding components are designated by the same reference numerals, and overlapping description is omitted.

FIG. 1 is a view showing a configuration of an embodiment of a solid-state imaging device according to the present invention. The solid-state imaging device 1 shown in FIG. 1 comprises a photodetecting section 10, a signal reading-out section 20, a row selecting section 30, a column selecting section 40, an overflow preventing section 50, and a controlling section 60. Moreover, in the case of usage as an X-ray flat panel, a scintillator panel is overlaid on the photodetecting surface 10 of the solid-state imaging device 1.

For the photodetecting section 10, M×N pixel portions $P_{1,1}$ to $P_{M,N}$ are two-dimensionally arrayed in a matrix of M rows and N columns. A pixel portion $P_{m,n}$ is located on the m-th row and the n-th column. Here, M and N are integers not less than 2, respectively, and m is an integer not less than 1 and not more than M, and n is an integer not less than 1 and not more than N. The pixel portions $P_{m,n}$ are pixel portions of the PPS type, and have a common configuration.

Each of the N pixel portions $P_{m,1}$ to $P_{m,N}$ belonging to the m-th row is connected to the row selecting section 30 and the overflow preventing section 50 via an m-th row selecting wiring $L_{V,m}$. Each output terminal of the M pixel portions $P_{1,n}$ to $P_{M,n}$ belonging to the n-th column is connected to an integrating circuit $S_n$ included in the signal reading-out section 20 via an n-th column reading-out wiring $L_{O,n}$.

The signal reading-out section 20 includes N integrating circuits $S_1$ to $S_N$ and N holding circuits $H_1$ to $H_N$. The integrating circuits $S_n$ have a common configuration. Moreover, the holding circuits $H_n$ also have a common configuration.

Each integrating circuit $S_n$ has an input terminal connected to the reading-out wiring $L_{O,n}$. Moreover, each integrating circuit $S_n$ accumulates charges inputted to the input terminal, and outputs a voltage value according to the accumulated charge amount from an output terminal to the holding circuit $H_n$. Each of the N integrating circuits $S_1$ to $S_N$ is connected to the controlling section 60 by a discharge controlling wiring $L_R$.

Each holding circuit $H_n$ has an input terminal connected to the output terminal of the integrating circuit $S_n$. Moreover, each holding circuit $H_n$ holds a voltage value inputted to the input terminal, and outputs the held voltage value from an output terminal to an output wiring $L_{out}$. Each of the N holding circuits $H_1$ to $H_N$ is connected to the controlling section 60 via a hold controlling wiring $L_H$. Moreover, each holding circuit $H_n$ is connected to the column selecting section 40 via an n-th column selecting wiring $L_{H,n}$.

The row selecting section 30 is connected to one end of each of the row selecting wirings $L_{V,1}$ to $L_{V,M}$. In FIG. 1, the row selecting section 30 is provided to the left of the photodetecting section 10. The row selecting section 30 outputs a row selecting controlling signal Vsel(m) to control an opening and closing operation of a reading-out switch included in each pixel portion $P_{m,n}$ of the photodetecting section 10 to the row selecting wiring $L_{V,m}$, sequentially row by row. As a result of the reading-out switch in a pixel portion connected via the row selecting wiring $L_{V,m}$ being closed upon receiving this output, a charge generated in a photodiode included in the pixel portion is outputted to the reading-out wiring $L_{O,n}$. M row selecting controlling signals Vsel(1) to Vsel(M) sequentially take significant values. The row selecting section 30 includes a shift register to sequentially output M row selecting controlling signals Vsel(1) to Vsel(M) as significant values.

The column selecting section 40 outputs an n-th column selecting controlling signal Hsel(n) to the n-th column selecting wiring $L_{H,n}$ to supply the n-th column selecting controlling signal Hsel(n) to the holding circuit $H_n$. N column selecting controlling signals Hsel(1) to Hsel(N) also sequentially take significant values. The column selecting section 40 includes a shift register to sequentially output N column selecting controlling signals Hsel(1) to Hsel(N) as significant values.

The overflow preventing section 50 is connected to the other end of each of the row selecting wirings $L_{V,1}$ to $L_{V,M}$. In FIG. 1, the overflow preventing section 50 is provided to the right of the photodetecting section 10. The overflow preventing section 50 outputs an overflow preventing signal to control an opening and closing operation of a reading-out switch included in each pixel portion $P_{m,n}$ of the photodetecting section 10 to any row selecting wiring $L_{V,m}$. As a result of the reading-out switch in a pixel portion connected via the row selecting wiring $L_{V,m}$ being closed upon receiving this output, a charge generated in a photodiode included in the pixel portion is prevented from overflowing outside the pixel portion.

The controlling section 60 controls operation of the solid-state imaging device 1 as a whole. The controlling section 60 supplies, to each of the row selecting section 30, the column selecting section 40, and the overflow preventing section 50, a controlling signal to control operation of these. The controlling section 60 outputs a discharge controlling signal Reset to the discharge controlling wiring $L_R$ to supply the discharge controlling signal Reset to each of the N integrating circuits $S_1$ to $S_N$. Moreover, the controlling section 60 outputs a hold controlling signal Hold to the hold controlling wiring $L_H$ to supply the hold controlling signal Hold to each of the N holding circuits $H_1$ to $H_N$.

The controlling section 60, as in the above, controls an opening and closing operation of a reading-out switch $SW_1$ included in each of the N pixel portions $P_{m,1}$ to $P_{m,N}$ belonging to the m-th row in the photodetecting section 10 via the row selecting section 30 or the overflow preventing section 50, and controls a holding operation and an output operation of a voltage value in the signal reading-out section 20 via the column selecting section 40 or directly. Accordingly, the controlling section 60 makes a voltage value according to the amount of charge generated in the photodiode PD included in each of the M×N pixel portions $P_{1,1}$ to $P_{M,N}$ in the photodetecting section 10 be repeatedly outputted as frame data from the signal reading-out section 20.

Figure 2:
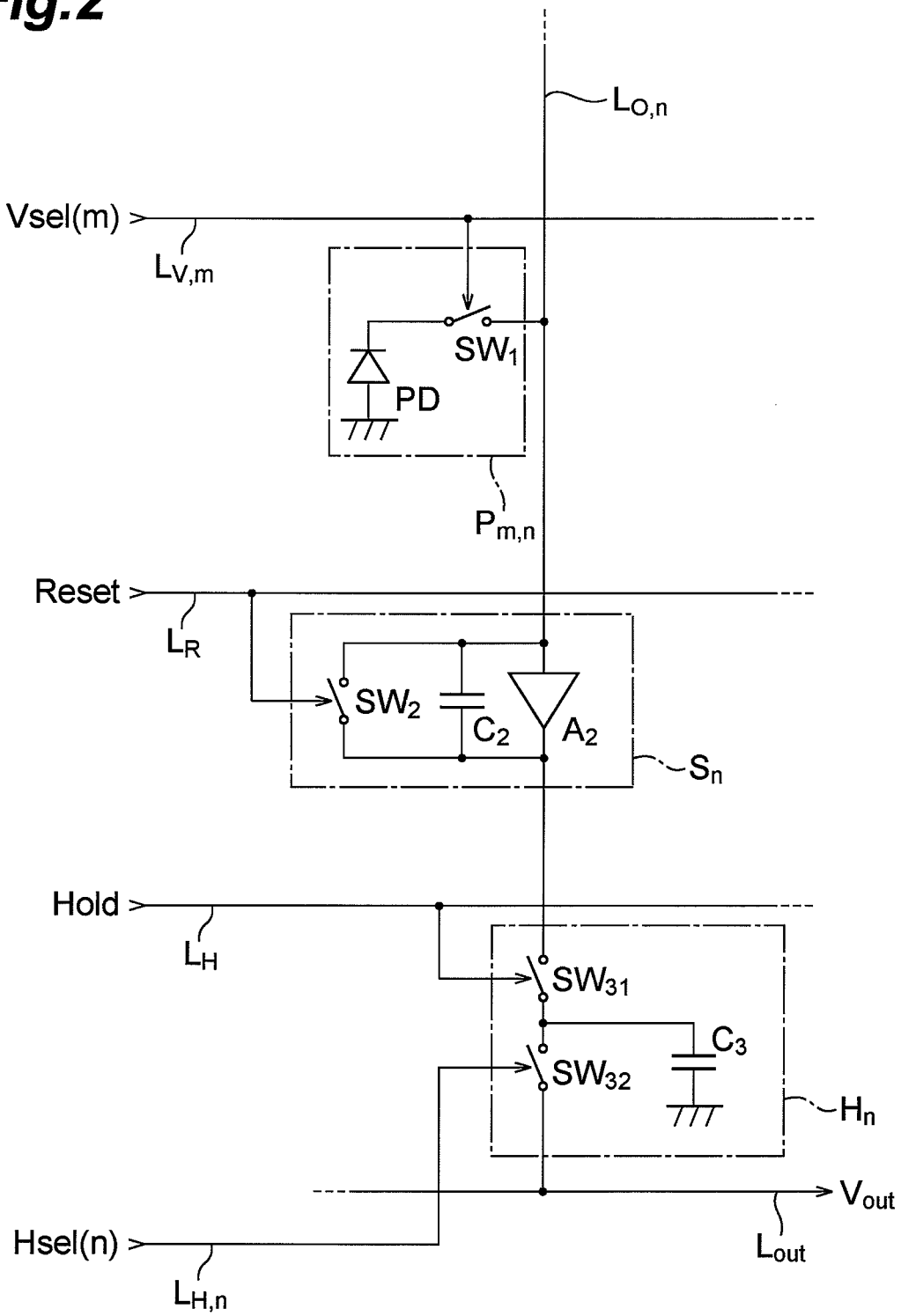
FIG. 2 is a circuit diagram of each of the pixel portion $P_{m,n}$, the integrating circuit $S_n$, and the holding circuit $H_n$ in the solid-state imager shown in FIG. 1.

FIG. 2 is a circuit diagram of each of the pixel portion $P_{m,n}$, the integrating circuit $S_n$, and the holding circuit $H_n$ included in the solid-state imaging device 1 shown in FIG. 1. Also, in FIG. 2, a circuit diagram of the pixel portion $P_{m,n}$ as a representative of the M×N pixel portions $P_{1,1}$ to $P_{M,N}$, a circuit diagram of the integrating circuit $S_n$ as a representative of the N integrating circuits $S_1$ to $S_N$, and a circuit diagram of the holding circuit $H_n$ as a representative of the N holding circuits $H_1$ to $H_N$ are shown. That is, in FIG. 2, circuit portions relating to the pixel portion $P_{m,n}$ on the m-th row and the n-th column and the n-th column reading-out wiring $L_{O,n}$ are shown.

The pixel portion $P_{m,n}$ includes a photodiode PD and a reading-out switch $SW_1$. The anode terminal of the photodiode PD is grounded, and the cathode terminal of the photodiode PD is connected to the n-th column reading-out wiring $L_{O,n}$ via the reading-out switch $SW_1$. The photodiode PD generates charge of an amount according to an incident light intensity, and accumulates the generated charge in a junction capacitance portion. The reading-out switch $SW_1$ is supplied with an m-th row selecting controlling signal via the m-th row selecting wiring $L_{V,m}$ from the row selecting section 30. The m-th row selecting controlling signal is an electrical signal that instructs an opening and closing operation of the reading-out switch $SW_1$ included in each of the N pixel portions $P_{m,1}$ to $P_{m,N}$ belonging to the m-th row in the photodetecting section 10.

In this pixel portion $P_{m,n}$, when the m-th row selecting controlling signal Vsel(m) is at low level, the reading-out switch $SW_1$ opens. Accordingly, a charge generated in the photodiode PD is not outputted to the n-th column reading-out wiring $L_{O,n}$ but is accumulated in the junction capacitance portion. On the other hand, when the m-th row selecting controlling signal Vsel(m) is at high level, the reading-out switch $SW_1$ closes. In this case, the charge generated in the photodiode PD and accumulated in the junction capacitance portion until then is outputted to the n-th column reading-out wiring $L_{O,n}$ through the reading-out switch $SW_1$.

The n-th column reading-out wiring $L_{O,n}$ is connected to the reading-out switch $SW_1$ included in each of the M pixel portions $P_{1,n}$ to $P_{M,n}$ belonging to the n-th column in the photodetecting section 10. The n-th column reading-out wiring $L_{O,n}$ reads out a charge generated in the photodiode PD included in any one of the M pixel portions $P_{1,n}$ to $P_{M,n}$ via the reading-out switch $SW_1$ included in the pixel portion and transfers the charge to the integrating circuit $S_n$.

The integrating circuit $S_n$ includes an amplifier $A_2$, an integrating capacitive element $C_2$, and a discharge switch $SW_2$. The integrating capacitive element $C_2$ and the discharge switch $SW_2$ are connected in parallel to each other, and provided between an input terminal and an output terminal of the amplifier $A_2$. The input terminal of the amplifier $A_2$ is connected to the n-th column reading-out wiring $L_{O,n}$. The discharge switch $SW_2$ is supplied with a discharge controlling signal Reset via the discharge controlling wiring $L_R$ from the controlling section 60. The discharge controlling signal Reset is an electrical signal that instructs an opening and closing operation of the discharge switch $SW_2$ included in the N integrating circuits $S_1$ to $S_N$.

In this integrating circuit $S_n$, when the discharge controlling signal Reset is at high level, the discharge switch $SW_2$ closes. Accordingly, the integrating capacitive element $C_2$ is discharged, and a voltage value to be outputted from the integrating circuit $S_n$ is initialized. On the other hand, when the discharge controlling signal Reset is at low level, the discharge switch $SW_2$ opens. In this case, a charge inputted to the input terminal is accumulated in the integrating capacitive element $C_2$, and a voltage value according to the accumulated charge amount is outputted from the integrating circuit $S_n$.

The holding circuit $H_n$ includes an input switch $SW_{31}$, an output switch $SW_{32}$, and a holding capacitive element $C_3$. One end of the holding capacitive element $C_3$ is grounded. The other end of the holding capacitive element $C_3$ is connected to the output terminal of the integrating circuit $S_n$ via the input switch $SW_{31}$, and connected to the voltage output wiring $L_{out}$ via the output switch $SW_{32}$. The input switch $SW_{31}$ is supplied with a hold controlling signal Hold via the hold controlling wiring $L_H$ from the controlling section 60. The hold controlling signal Hold is an electrical signal that instructs an opening and closing operation of the input switch $SW_{31}$ included in each of the N holding circuits $H_1$ to $H_N$. The output switch $SW_{32}$ is supplied with an n-th column selecting controlling signal Hsel(n) via the n-th column selecting wiring $L_{H,n}$ from the column selecting section 40. The n-th column selecting controlling signal Hsel(n) is an electrical signal that instructs an opening and closing operation of the output switch $SW_{32}$ included in the holding circuit $H_n$.

In this holding circuit $H_n$, when the hold controlling signal Hold switches from high level to low level, the input switch $SW_{31}$ switches from a closed state to an open state. At this time, a voltage value being inputted to the input terminal is held in the holding capacitive element $C_3$. When the n-th column selecting controlling signal Hsel(n) is at high level, the output switch $SW_{32}$ closes. In this case, the voltage value held in the holding capacitive element $C_3$ is outputted to the voltage output wiring $L_{out}$.

When outputting a voltage value according to a received light intensity in each of the N pixel portions $P_{m,1}$ to $P_{m,N}$ belonging to the m-th row in the photodetecting section 10, the controlling section 60 outputs a discharge controlling signal Reset to instruct temporary closing and then opening of the discharge switch $SW_2$ included in each of the N integrating circuits $S_1$ to $S_N$. The controlling section 60 then outputs an m-th row selecting controlling signal Vsel(m) to be outputted from the row selecting section 30 to instruct closing of the reading-out switch $SW_1$ included in each of the N pixel portions $P_{m,1}$ to $P_{m,N}$ belonging to the m-th row in the photodetecting section 10 for a predetermined period. The controlling section 60, in the predetermined period, outputs a hold controlling signal Hold to instruct switching of the input switch $SW_{31}$ included in each of the N holding circuits $H_1$ to $H_N$ from a closed state to an open state. Then, the controlling section 60, after the predetermined period, outputs column selecting controlling signals Hsel(1) to Hsel(N) to be outputted from the column selecting section 40 to instruct sequential closing of the output switches $SW_{32}$ included in the N holding circuits $H_1$ to $H_N$ for a predetermined period. The controlling section 60 performs such a control for the respective rows in sequence.

Next, operation of the solid-state imaging device 1 according to the present invention will be described. In the solid-state imaging device 1, as a result of level changes of each of the M row selecting controlling signals Vsel(1) to Vsel(M), the N column selecting controlling signals Hsel(1) to Hsel(N), the discharge controlling signal Reset, and the hold controlling signal Hold at predetermined timings under control by the controlling section 60, light made incident on the photodetecting surface 10 can be imaged to obtain frame data.

Figure 3:
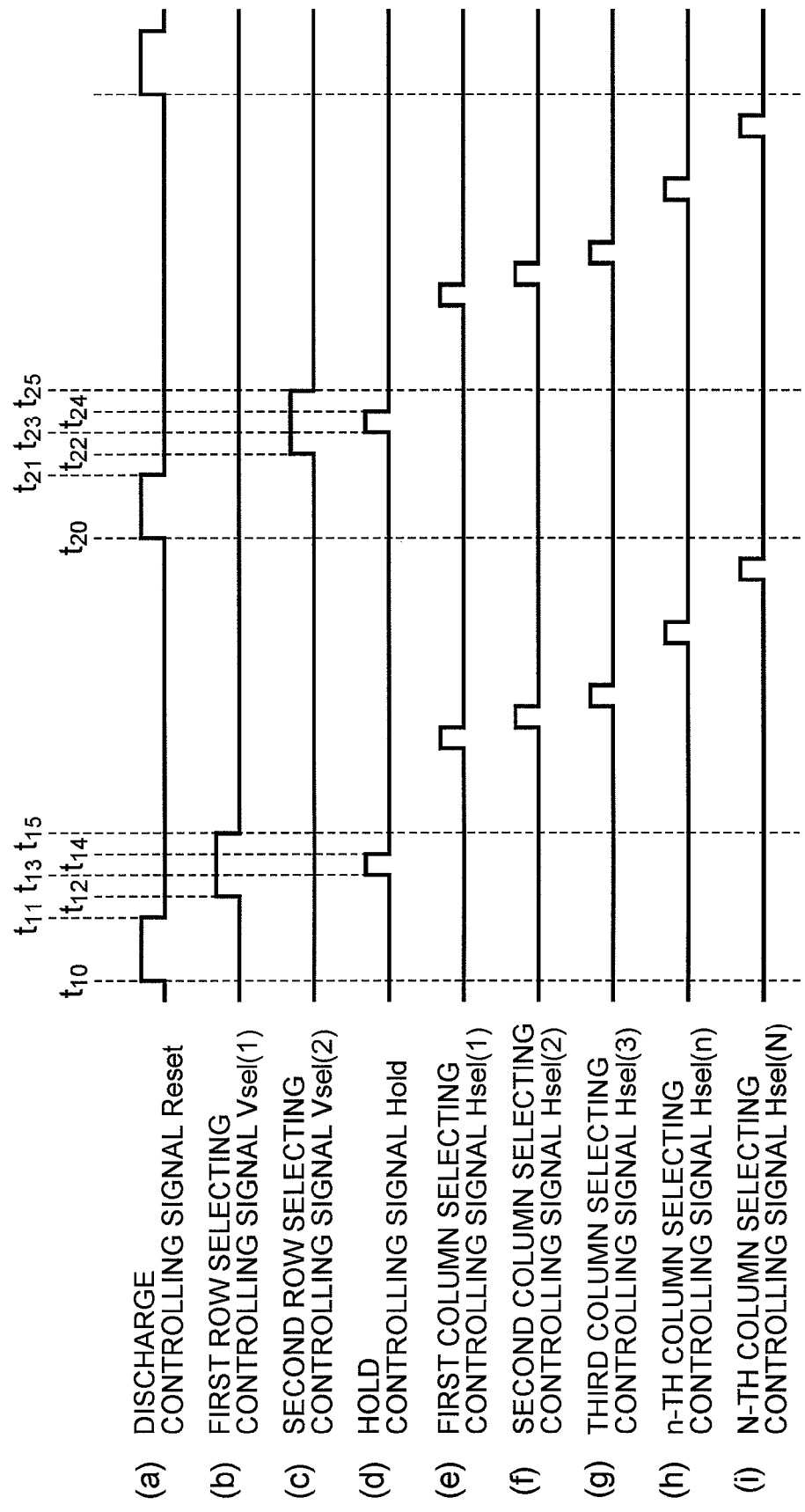
FIG. 3 is a timing chart for explaining operation of the solid-state imager shown in FIG. 1.

FIG. 3 is a timing chart for explaining operation of the solid-state imaging device 1 according to the present invention. FIG. 3 shows (a) the discharge controlling signal Reset for instructing an opening and closing operation of the discharge switch $SW_2$ included in each of the N integrating circuits $S_1$ to $S_N$, (b) the first row selecting controlling signal Vsel(1) for instructing an opening and closing operation of the reading-out switch $SW_1$ included in each of the N pixel portions $P_{1,1}$ to $P_{1,N}$ belonging to the first row in the photodetecting section 10, (c) the second row selecting controlling signal Vsel(2) for instructing an opening and closing operation of the reading-out switch $SW_1$ included in each of the N pixel portions $P_{2,1}$ to $P_{2,N}$ belonging to the second row in the photodetecting section 10, and (d) the hold controlling signal Hold for instructing an opening and closing operation of the input switch $SW_{31}$ included in each of the N holding circuits $H_1$ to $H_N$.

Moreover, FIG. 3 further subsequently shows (e) the first column selecting controlling signal Hsel(1) for instructing an opening and closing operation of the output switch $SW_{32}$ included in the holding circuit $H_1$, (f) the second column selecting controlling signal Hsel(2) for instructing an opening and closing operation of the output switch $SW_{32}$ included in the holding circuit $H_2$, (g) the third column selecting controlling signal Hsel(3) for instructing an opening and closing operation of the output switch $SW_{32}$ included in the holding circuit $H_3$, (h) the n-th column selecting controlling signal Hsel(n) for instructing an opening and closing operation of the output switch $SW_{32}$ included in the holding circuit $H_n$, and (i) the N-th column selecting controlling signal Hsel(N) for instructing an opening and closing operation of the output switch $SW_{32}$ included in the holding circuit $H_N$.

A charge generated in the photodiode PD included in each of the N pixel portions $P_{1,1}$ to $P_{1,N}$ belonging to the first row and accumulated in the junction capacitance portion is reading-out as follows.

That is, before the time $t_{10}$, the M row selecting controlling signals Vsel(1) to Vsel(M), the N column selecting controlling signals Hsel(1) to Hsel(N), the discharge controlling signal Reset, and the hold controlling signal Hold have been made at low level. During a period from the time $t_{10}$ to $t_{11}$, the discharge controlling signal Reset to be outputted from the controlling section 60 to the discharge controlling wiring $L_R$ becomes high level. Accordingly, in each of the N integrating circuits $S_1$ to $S_N$, the discharge switch $SW_2$ closes (the integrating capacitive element $C_2$ is discharged). Moreover, during a period from the time $t_{12}$ to the time $t_{15}$ after the time $t_{11}$, the first row selecting controlling signal Vsel(1) to be outputted from the row selecting section 30 to the first row selecting wiring $L_{V,1}$ becomes high level. Accordingly, the reading-out switch $SW_1$ included in each of the N pixel portions $P_{1,1}$ to $P_{1,N}$ belonging to the first row in the photodetecting section 10 closes.

In the period ($t_{12}$ to $t_{15}$), during a period from the time $t_{13}$ to the time $t_{14}$, the hold controlling signal Hold to be outputted from the controlling section 60 to the hold controlling wiring $L_H$ becomes high level. In this case, the input switch $SW_{31}$ closes in each of the N holding circuits $H_1$ to $H_N$.

In the period ($t_{12}$ to $t_{15}$), the reading-out switch $SW_1$ included in each pixel portion $P_{1,n}$ of the first row is closed. Since the discharge switch $SW_2$ of each integrating circuit $S_n$ is open, a charge generated in the photodiode PD of each pixel portion $P_{1,n}$ and accumulated in the junction capacitance portion until then is transferred to and accumulated in the integrating capacitive element $C_2$ of the integrating circuit $S_n$ through the reading-out switch $SW_1$ of the pixel portion $P_{1,n}$ and the n-th column reading-out wiring $L_{O,n}$. Then, a voltage value according to the amount of charge accumulated in the integrating capacitive element $C_2$ of each integrating circuit $S_n$ is outputted from the output terminal of the integrating circuit $S_n$.

At the time $t_{14}$ in the period ($t_{12}$ to $t_{15}$), the hold controlling signal Hold switches from high level to low level. Accordingly, in each of the N holding circuits $H_1$ to $H_N$, the input switch $SW_{31}$ switches from a closed state to an open state. At this time, a voltage value being outputted from the output terminal of the integrating circuit $S_n$ and being inputted to the input terminal of the holding circuit $H_n$ is held in the holding capacitive element $C_3$.

Then, after the period ($t_{12}$ to $t_{15}$), column selecting controlling signals Hsel(1) to Hsel(N) to be outputted from the column selecting section 40 to the column selecting wirings $L_{H,1}$ to $L_{H,N}$ sequentially become high level for a predetermined period. At this time, the output switches $SW_{32}$ included in the N holding circuits $H_1$ to $H_N$ sequentially close for the predetermined period. When the output switches $SW_{32}$ have closed, the voltage values held in the holding capacitive elements $C_3$ of the holding circuits $H_n$ are sequentially outputted to the voltage output wiring $L_{out}$ through the output switches $SW_{32}$. The voltage value $V_{out}$ to be outputted to the voltage output wiring $L_{out}$ is a voltage value indicating the received light intensity in the photodiode PD included in each of the N pixel portions $P_{1,1}$ to $P_{1,N}$ belonging to the first row.

Subsequently, a charge generated in the photodiode PD included in each of the N pixel portions $P_{2,1}$ to $P_{2,N}$ belonging to the second row and accumulated in the junction capacitance portion is reading-out as follows.

That is, during a period from the time $t_{20}$ to the time $t_{21}$, the discharge controlling signal Reset to be outputted from the controlling section 60 to the discharge controlling wiring $L_R$ becomes high level. Accordingly, in each of the N integrating circuits $S_1$ to $S_N$, the discharge switch $SW_2$ closes, and the integrating capacitive element $C_2$ is discharged. Moreover, during a period from the time $t_{22}$ to the time $t_{25}$ after the time $t_{21}$, the second row selecting controlling signal Vsel(2) to be outputted from the row selecting section 30 to the second row selecting wiring $L_{V,2}$ becomes high level. Accordingly, the reading-out switch $SW_1$ included in each of the N pixel portions $P_{2,1}$ to $P_{2,N}$ belonging to the second row in the photodetecting section 10 closes.

In the period ($t_{22}$ to $t_{25}$), during a period from the time $t_{23}$ to the time $t_{24}$, the hold controlling signal Hold to be outputted from the controlling section 60 to the hold controlling wiring $L_H$ becomes high level. In this case, input switch $SW_{31}$ closes in each of the N holding circuits $H_1$ to $H_N$.

Then, after the period ($t_{22}$ to $t_{25}$), column selecting controlling signals Hsel(1) to Hsel(N) to be outputted from the column selecting section 40 to the column selecting wirings $L_{H,1}$ to $L_{H,N}$ sequentially become high level for a predetermined period. Accordingly, the output switches $SW_{32}$ included in the N holding circuits $H_1$ to $H_N$ sequentially close for the predetermined period.

Thus, a voltage value $V_{out}$ indicating the received light intensity in the photodiode PD included in each of the N pixel portions $P_{2,1}$ to $P_{2,N}$ belonging to the second row is outputted to the voltage output wiring $L_{out}$.

Subsequent to the operation for the first and the second rows as in the above, the same operation is performed for the third to the M-th rows, so that frame data indicating an image captured in one time of imaging is obtained. When the operation is completed for the M-th row, the same operation is again performed in order from the first row, and frame data indicating a next image is obtained. By thus repeating the same operation with a predetermined period, voltage values $V_{out}$ indicating a two-dimensional intensity distribution of an image of light received by the photodetecting section 10 are outputted to the voltage output wiring $L_{out}$ (frame data is repeatedly obtained).

Meanwhile, in the period during which the reading-out switch $SW_1$ included in each of the N pixel portions $P_{m,1}$ to $P_{m,N}$ belonging to the m-th row is closed, a charge generated in the photodiode PD of each pixel portion $P_{m,n}$ of the m-th row and accumulated in the junction capacitance portion is transferred to the integrating capacitive element $C_2$ of the integrating circuit $S_n$ through the reading-out switch $SW_1$ of the pixel portion $P_{m,n}$ and the n-th column reading-out wiring $L_{O,n}$. At this time, the accumulated charge in the junction capacitance portion of the photodiode PD of each pixel portion $P_{m,n}$ belonging to the m-th row is initialized.

However, when a certain m-th row selecting wiring $L_{V,m}$ is disconnected at a point halfway, pixel portions located farther from the row selecting section 30 than the disconnected point among the N pixel portions $P_{m,1}$ to $P_{m,N}$ belonging to the m-th row are not transmitted with an m-th row selecting controlling signal Vsel(m) from the row selecting section 30, and the reading-out switches $SW_1$ remain open. Since charges cannot therefore be transferred to the integrating circuit $S_n$, initialization of the accumulated charges in the junction capacitance portions of the photodiodes PD by this charge transfer is impossible. If this goes on, charges generated in the photodiodes in response to light incidence in these pixel portions are just accumulated in the junction capacitance portions of the photodiodes. In the case that the charges exceed the saturation level, they overflow to pixel portions belonging to neighboring rows and cause defective lines in pixel portions of the three consecutive rows.

The solid-state imaging device 1 includes the overflow preventing section 50 in order to cope with such problems. The row selecting section 30 is connected to one end of each of the row selecting wirings $L_{V,1}$ to $L_{V,M}$, whereas the overflow preventing section 50 is connected to the other end of each of the row selecting wirings $L_{V,1}$ to $L_{V,M}$. That is, the m-th row selecting wiring $L_{V,m}$ is interposed between the row selecting section 30 and the overflow preventing section 50. Moreover, the m-th row selecting wiring $L_{V,m}$ is connected to the reading-out switch $SW_1$ included in each of the N pixel portions $P_{m,1}$ to $P_{m,N}$ belonging to the m-th row in the photodetecting section 10, and transmits a signal to control an opening and closing operation of these reading-out switches $SW_1$ to these reading-out switches $SW_1$. The signal to control an opening and closing operation of the reading-out switch $SW_1$ is supplied from the row selecting section 30 as a row selecting controlling signal Vsel(m), and supplied from the overflow preventing section 50 as an overflow preventing signal.

The overflow preventing signal to be outputted from the overflow preventing section 50, which is outputted to the m-th row selecting wiring $L_{V,m}$, is thus the same as the row selecting controlling signals Vsel(1) to Vsel(M) to be outputted from the row selecting section 30 in the point of controlling an opening and closing operation of the reading-out switch $SW_1$ of the pixel portion $P_{m,n}$.

However, the row selecting controlling signals Vsel(1) to Vsel(M) to be outputted from the row selecting section 30 are electrical signals for reading out a charge from each pixel portion $P_{m,n}$ in the photodetecting section 10. In contrast thereto, the overflow preventing signal to be outputted from the overflow preventing section 50 is an electrical signal that is, when any one of the row selecting wirings $L_{V,1}$ to $L_{V,M}$ is disconnected in the photodetecting section 10, by closing the reading-out switches $SW_1$ in pixel portions located farther from the row selecting section 30 than the disconnected point among the pixel portions to be connected to the disconnected row selecting wiring, for preventing charges generated in the photodiodes PD included in the pixel portions from overflowing outside the pixel portions.

Therefore, the row selecting controlling signals Vsel(1) to Vsel(M) to be outputted from the row selecting section 30 are outputted with a predetermined period sequentially row by row. In contrast thereto, the overflow preventing signal to be outputted from the overflow preventing section 50 is selectively outputted to that disconnected row selecting wiring, or outputted to each of that disconnected row selecting wiring and row selecting wirings neighboring the disconnected row selecting wiring. It is not always necessary that the overflow preventing signal to be outputted from the overflow preventing section 50 is outputted to a non-disconnected row selecting wiring.

The overflow preventing signal to be outputted from the overflow preventing section 50 may be outputted at a timing different from that of outputting the row selecting controlling signal from the row selecting section 30 to the row selecting wiring. For example, it is preferably after all the row selecting controlling signals Vsel(1) to Vsel(M) have been outputted from the row selecting section 30 and voltage values $V_{out}$ for one frame have been outputted from the signal reading-out section 20 and before voltage values $V_{out}$ for the next one frame are outputted from the signal reading-out section 20. In this case, when a plurality of row selecting wirings are disconnected, it is preferable that overflow preventing signals are simultaneously outputted to these row selecting wirings from the overflow preventing section 50.

The overflow preventing signal to be outputted from the overflow preventing section 50 may be outputted at the same timing as that of outputting the row selecting controlling signal from the row selecting section 30 to the row selecting wiring. That is, to the disconnected m-th row selecting wiring $L_{V,m}$, the overflow preventing signal is outputted from the overflow preventing section 50 at the same timing as the timing where the row selecting controlling signal Vsel(m) is outputted from the row selecting section 30. In this case, among the N pixel portions $P_{m,1}$ to $P_{m,N}$ connected to the disconnected m-th row selecting wiring $L_{V,m}$, pixel portions located closer to the row selecting section 30 than the disconnected point are supplied with the row selecting controlling signal Vsel(m) from the row selecting section 30. Moreover, at the same timing as this, pixel portions located farther from the row selecting section 30 than the disconnected point are supplied with the overflow preventing signal from the overflow preventing section 50.

Therefore, the reading-out switches $SW_1$ close at the same timing in all N pixel portions $P_{m,1}$ to $P_{m,N}$ connected to the disconnected m-th row selecting wiring $L_{V,m}$. Accordingly, a charge generated in the photodiode PD of each pixel portion $P_{m,n}$ and accumulated in the junction capacitance portion until then is transferred to the signal reading-out section 20 via the reading-out switch $SW_1$ of the pixel portion $P_{m,n}$ and the n-th column reading-out wiring $L_{O,n}$. Then, a voltage value $V_{out}$ indicating the received light intensity in the photodiode PD included in each of the N pixel portions $P_{m,1}$ to $P_{m,N}$ belonging to the m-th row is outputted from the signal reading-out section 20 to the voltage output wiring $L_{out}$.

Thus, in the solid-state imaging device 1, even when any row selecting wiring is disconnected, from the overflow preventing section 50 provided on the side opposite to the row selecting section 30 with respect to the disconnected row selecting wiring, an overflow preventing signal is supplied to pixel portions not connected to the row selecting section 30 due to the disconnection. Accordingly, also in the pixel portions not connected to the row selecting section 30 due to the disconnection, the reading-out switches $SW_1$ close based on the overflow preventing signal supplied from the overflow preventing section 50. Consequently, the charges generated in the photodiodes in response to light incidence and accumulated in the junction capacitance portions are discharged before reaching the saturation level, and never overflow to neighboring pixel portions. Therefore, in the solid-state imaging device 1, it is unnecessary to perform such a correction process as in the conventional solid-state imaging device, and a high-resolution image is obtained.

Particularly, when an overflow preventing signal is outputted to a row selecting wiring from the overflow preventing section 50 at the same timing as the timing to output a row selecting controlling signal from the row selecting section 30 to the row selecting wiring, a charge can also be reading-out of a pixel portion which the overflow preventing signal reaches. When the row selecting wiring is disconnected at only one point, in the same manner as in the case without disconnection, voltage values $V_{out}$ indicating a two-dimensional intensity distribution of an image of light received by the photodetecting section 10 are outputted from the signal reading-out section 20 to the voltage output wiring $L_{out}$.

Next, configuration examples of each of the row selecting section 30 and the overflow preventing section 50 included in the solid-state imaging device 1 according to the present invention will be described.

Figure 4:
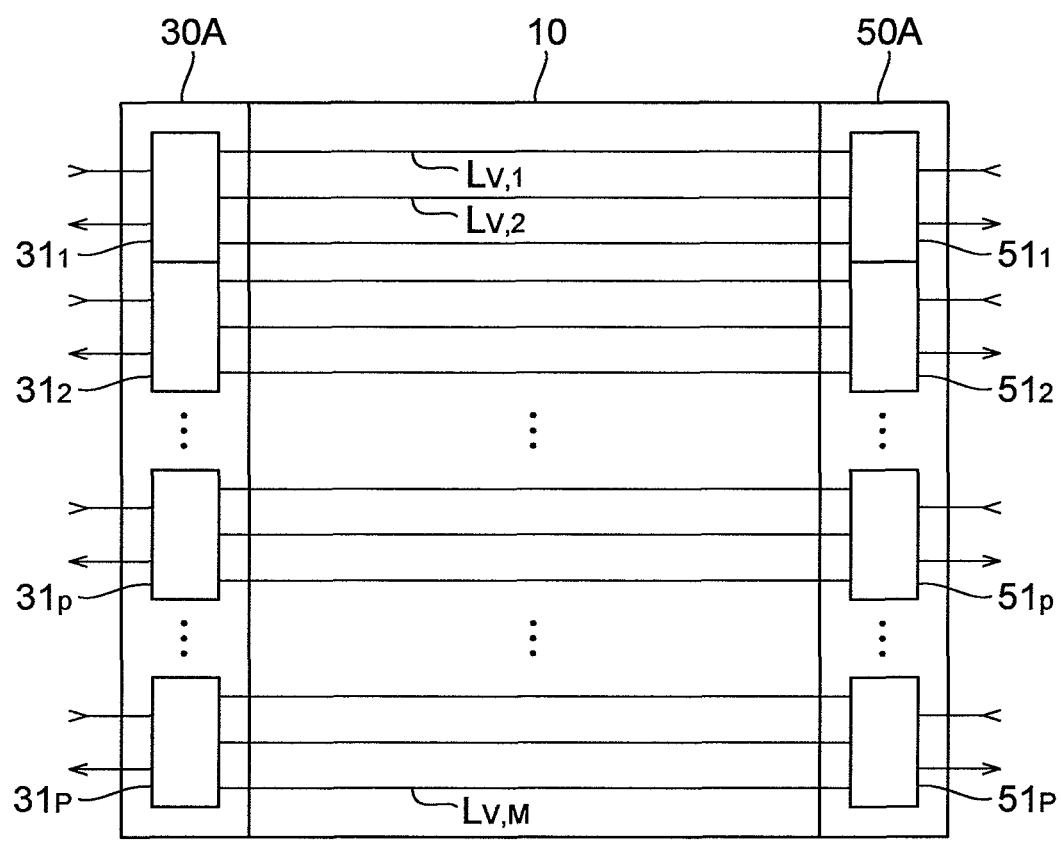
FIG. 4 is a view showing a first configuration example of a row selecting section and an overflow preventing section in the solid-state imager shown in FIG. 1.
Figure 5:
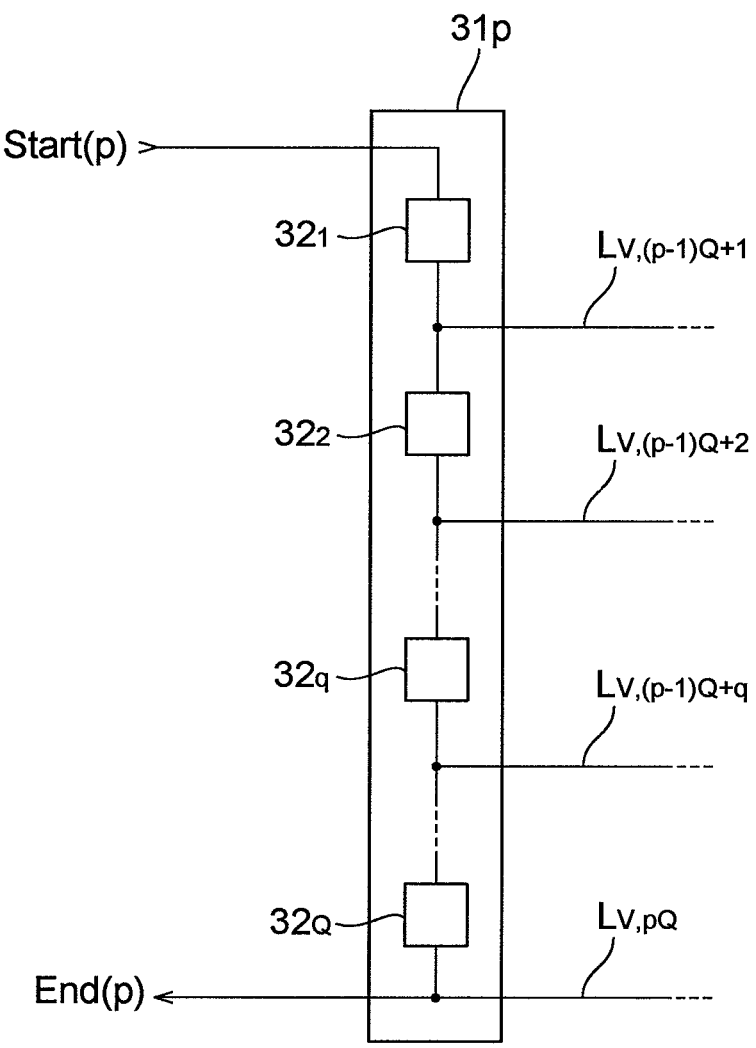
FIG. 5 is a view showing a configuration of a shift register included in the row selecting section shown in FIG. 4.

FIG. 4 is a view showing a first configuration example of the row selecting section 30 and the overflow preventing section 50. In the first configuration example shown in FIG. 4, a row selecting section 30A serving as the row selecting section 30 in FIG. 1 includes P shift registers $31_1$ to $31_P$. Moreover, an overflow preventing section 50A serving as the overflow preventing section 50 in FIG. 1 includes P shift registers $51_1$ to $51_P$. The shift registers $31_p$ and the shift registers $51_p$ have a common configuration, and as shown in FIG. 5, are Q-bit shift registers. Here, P and Q are integers not less than 2, and p is an integer not less than 1 and not more than P, and q to be mentioned in the following is an integer not less than 1 and not more than Q. A product of P and Q equals the number of rows M.

FIG. 5 is a view showing a configuration of the shift register $31_p$. For the shift register $31_p$, Q flip-flops $32_1$ to $32_Q$ are linearly connected. An output terminal of the flip-flop $32_q$ included in the shift register $31_p$ is connected to an m-th row selecting wiring $L_{V,(p-1)Q+q}$. To an input terminal of the first-stage flip-flop $32_1$ included in the shift register $31_p$, a start signal Start(p) is inputted from the controlling section 60. From an output terminal of the final-stage flip-flop $32_Q$ included in the shift register $31_p$, an end signal End(p) is outputted to the controlling section 60.

In the shift register $31_p$, when a pulse of the start signal Start(p) is inputted from the controlling section 60 to the input terminal of the first-stage flip-flop $32_1$, in synchronization with a clock signal to be inputted to each of the Q flip-flops $32_1$ to $32_Q$, pulses are sequentially outputted from the output terminal of each of the Q flip-flops $32_1$ to $32_Q$ as a row selecting controlling signal. Then, a pulse to be outputted from the output terminal of the final-stage flip-flop $32_Q$ is outputted also to the controlling section 60 as the end signal End(p).

In the row selecting section 30A, pulses of the start signal Start(p) are sequentially inputted to the P shift registers $31_1$ to $31_P$, and the row selecting controlling signals Vsel(1) to Vsel(M) are sequentially outputted to the row selecting wirings with a predetermined period.

In the overflow preventing section 50A, pulses of the start signal Start(p) may be sequentially inputted to the P shift registers $51_1$ to $51_P$, and overflow preventing signals may be outputted to the respective row selecting wirings. Alternatively, a pulse of the start signal Start(p) may be inputted only to the shift register $51_p$ connected to a disconnected row selecting wiring among the P shift registers $51_1$ to $51_P$. In the former case, the power consumption is small, which is preferable. Moreover, in the latter case, the influence of inrush current onto the row selecting section 30A or the overflow preventing section 50A that occurs when the input timing of the row selecting controlling signal and overflow preventing signal from both ends of the row selecting wiring is shifted from each other is small, which is also preferable.

Figure 6:
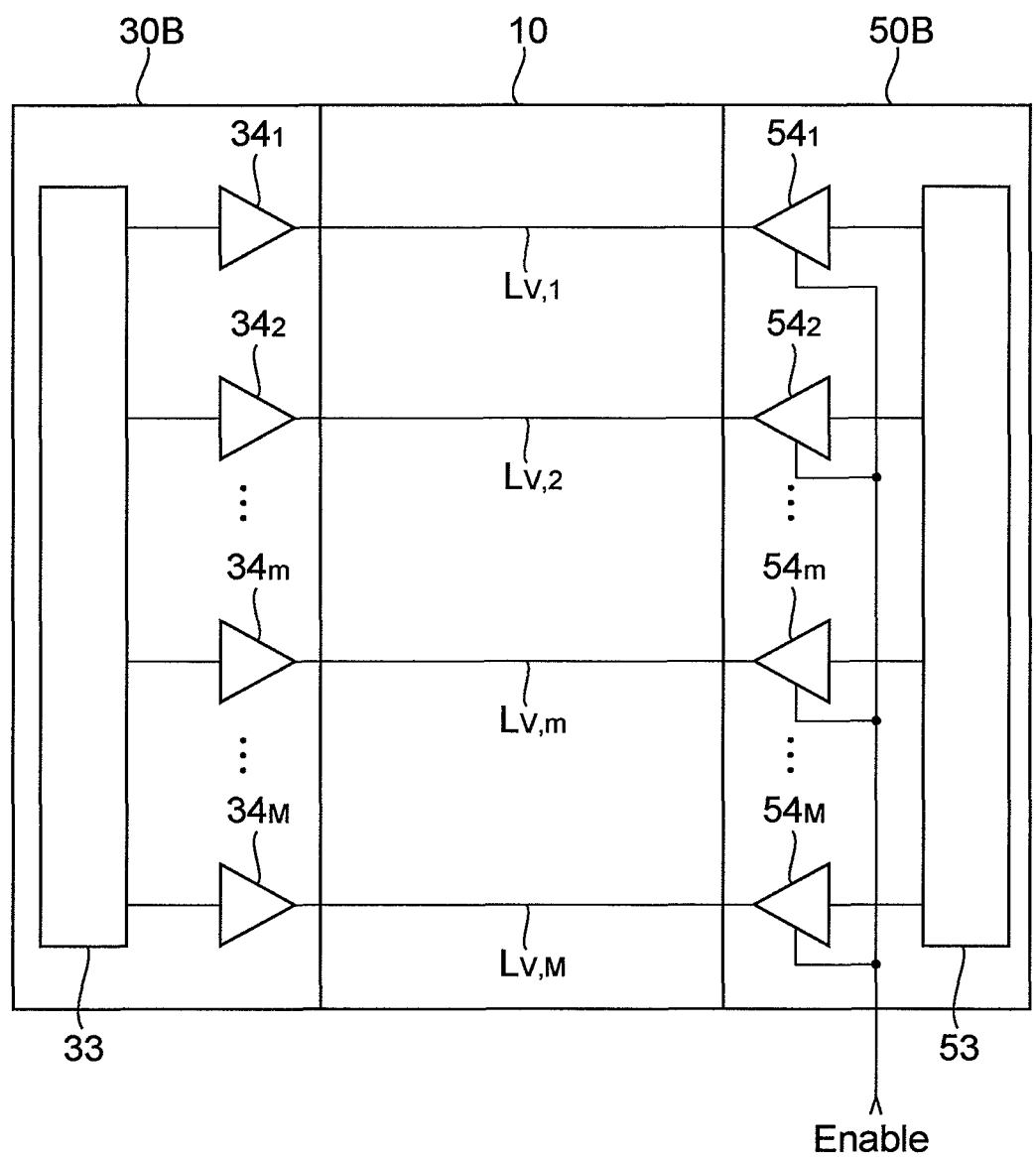
FIG. 6 is a view showing a second configuration example of a row selecting section and an overflow preventing section in the solid-state imager shown in FIG. 1.

FIG. 6 is a view showing a second configuration example of the row selecting section 30 and the overflow preventing section 50. In the second configuration example of FIG. 6, a row selecting section 30B serving as the row selecting section 30 in FIG. 1 includes an M-bit shift register 33 and M digital buffers $34_1$ to $34_M$. Moreover, an overflow preventing section 50B serving as the overflow preventing section 50 in FIG. 1 includes an M-bit shift register 53 and M 3-state buffers $54_1$ to $54_M$.

In the row selecting section 30B, when a pulse of the start signal is inputted from the controlling section 60, in synchronization with a clock signal, the row selecting controlling signals Vsel(1) to Vsel(M) are sequentially outputted with a predetermined period. The row selecting controlling signal Vsel(m) is outputted to the m-th row selecting wiring $L_{V,m}$ through the digital buffer $34_m$.

In the overflow preventing section 50B, when a pulse of the start signal is inputted from the controlling section 60, in synchronization with a clock signal, overflow preventing signals are sequentially outputted row by row with a predetermined period. The overflow preventing signal having been outputted corresponding to the m-th row selecting wiring $L_{V,m}$ is inputted to the 3-state buffer $54_m$, and is outputted from the 3-state buffer $54_m$ to the m-th row selecting wiring $L_{V,m}$ when an enable signal Enable supplied from the controlling section 60 is at high level. However, when the enable signal Enable is at low level, an output terminal of the 3-state buffer $54_m$ is brought in a high-impedance state.

Therefore, in the overflow preventing section 50B, the overflow preventing signal can be selectively outputted to a disconnected row selecting wiring. Moreover, as a result of bringing the output terminal of the 3-state buffer $54_m$ corresponding to a non-disconnected row selecting wiring into a high-impedance state, the influence of inrush current onto the row selecting section 30B or the overflow preventing section 50B is small.

The solid-state imaging device 1 (FIG. 1) according to the present invention can be suitably used in an X-ray CT apparatus. Therefore, an example of an X-ray CT apparatus including the solid-state imaging device 1 according to the present invention will be described in the following.

Figure 7:
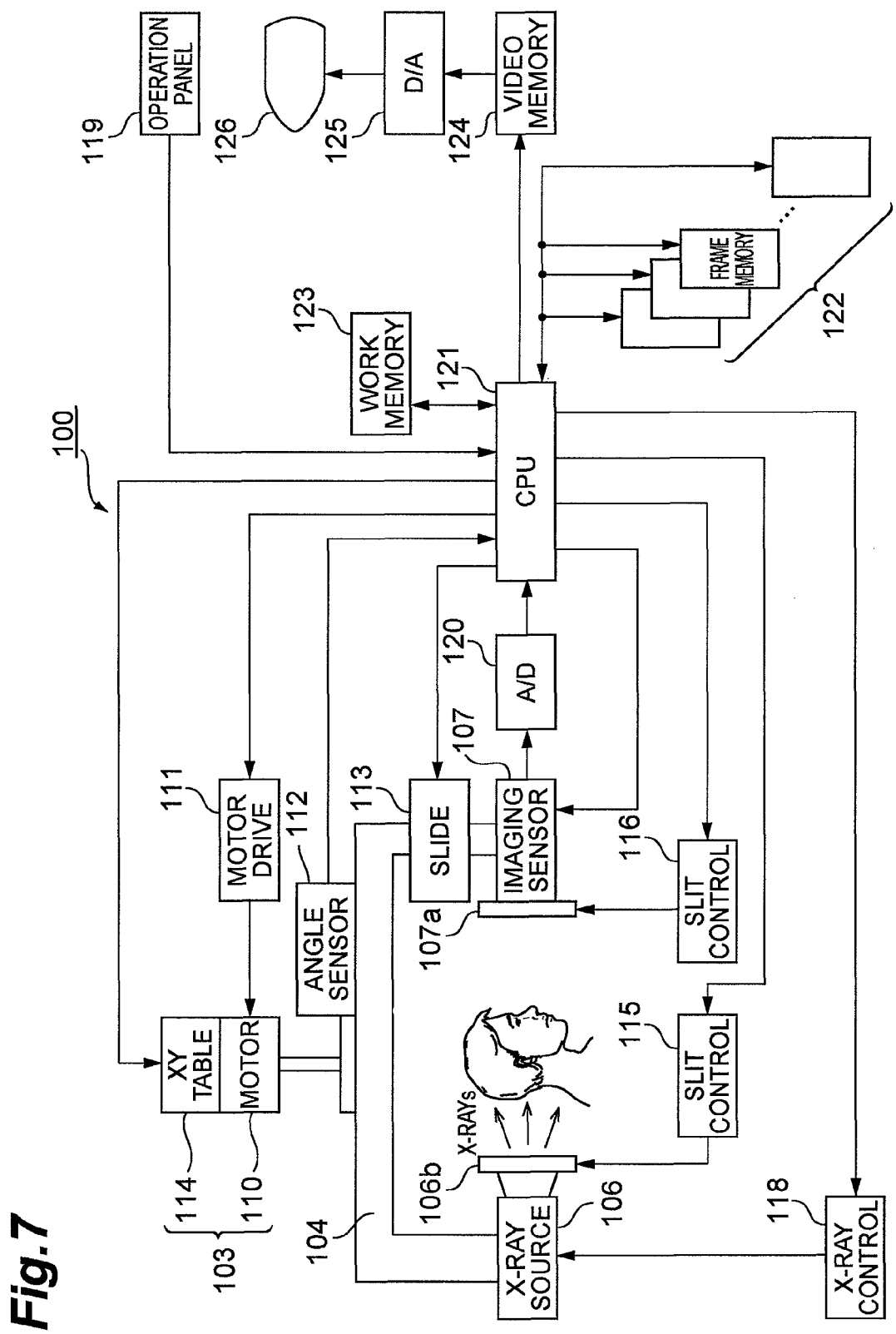
FIG. 7 is a view showing a configuration of an embodiment of an X-ray CT apparatus according to the present invention.

FIG. 7 is a view showing a configuration of an example of an X-ray CT apparatus according to the present invention. In the X-ray CT apparatus 100 shown in FIG. 7, an X-ray source 106 generates X-rays toward a subject. The radiation field of X-rays generated from the X-ray source 106 is controlled by a primary slit plate 106b. The X-ray source 106 has a built-in X-ray tube, and by adjusting conditions of the X-ray tube, such as a tube voltage, a tube current, and energization time, the X-ray dose to the subject is controlled. An X-ray image sensor 107 has a built-in CMOS solid-state imaging device having a plurality of pixel portions arrayed two-dimensionally, and detects an X-ray image transmitted through the subject. In front of the X-ray image sensor 107, a secondary slit plate 107a that limits an X-ray incident region is provided.

While holding the X-ray source 106 and the X-ray image sensor 107 so as to be opposed, a swing arm 104 swings these around the subject in panoramic tomography. Moreover, in the case of linear tomography, a sliding mechanism 113 for linearly displacing the X-ray image sensor 107 with respect to the subject is provided. The swing arm 104 is driven by an arm motor 110 that forms a rotary table, and a rotation angle thereof is detected by an angle sensor 112. Moreover, the arm motor 110 is mounted on a movable portion of an XY table 114, and the center of rotation is arbitrarily adjusted in a horizontal plane.

Image signals outputted from the X-ray image sensor 107 are converted to, for example, 10-bit (=1024 level) digital data by an AD converter 120. This digital data is once taken in a CPU (Central Processing Unit) 121 and then stored in a frame memory 122. From the image data stored in the frame memory 122, a tomographic image along any tomographic plane is reproduced by a predetermined arithmetic processing. The reproduced tomographic image is outputted to a video memory 124, and converted to analog signals by a DA converter 125. Thereafter, the tomographic image converted to analog signals is displayed by an image display section 126 such as a CRT (cathode ray tube), and provided for various diagnoses.

The CPU 121 is connected with a work memory 123 required for signal processing, and further connected with an operation panel 119 having a panel switch, an X-ray irradiation switch, etc. Moreover, the CPU 121 is connected to a motor drive circuit 111 that drives the arm motor 110, slit control circuits 115, 116 that control the opening range of the primary slit plate 106b and the secondary slit plate 107a, an X-ray control circuit 118 that controls the X-ray source 106, respectively, and further outputs a clock signal to drive the X-ray image sensor 107.

The X-ray control circuit 118 is capable of feedback-controlling the X-ray dose to the subject based on signals imaged by the X-ray image sensor 107.

In the X-ray CT apparatus 100 configured as above, the X-ray image sensor 107 is equivalent to the photodetecting section 10, the signal reading-out section 20, the row selecting section 30, the column selecting section 40, the overflow preventing section 50, and the controlling section 60 of the solid-state imaging device 1 (an example of a solid-state imaging device according to the present invention) having a structure as described above, and a scintillator panel is provided at the front of the photodetecting section 10.

As a result of including the solid-state imaging device 1 having a structure shown in FIG. 1, the X-ray CT apparatus 100 can capture a high-resolution tomographic image even in the vicinity of a defective line. Particularly, in the X-ray CT apparatus, a large number of (for example, 300) frames of data are successively obtained in a short period, and the amount of incident light into the photodetecting section 10 of the solid-state imaging device 1 varies frame by frame. Moreover, the amount of charges overflowing from pixel portions on a defective line to pixel portions on neighboring lines varies frame by frame. As a result of including the solid-state imaging device 1 in such an X-ray CT apparatus, the X-ray CT apparatus can capture a high-resolution image even when any row selecting wiring is disconnected.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

The invention claimed is:

1. A solid-state imaging device, comprising:
a photodetecting section having M (an integer not less than 2)×N (an integer not less than 2) pixel portions $P_{1,1}$ to $P_{M,N}$ two-dimensionally arrayed so as to form a matrix of M rows and N columns, each of the pixel portions $P_{1,1}$ to $P_{M,N}$ including a photodiode that generates charge of an amount according to an incident light intensity, and a reading-out switch connected to the photodiode;
a plurality of reading-out wirings $L_{O,1}$ to $L_{O,N}$, a reading-out wiring $L_{O,n}$ of the plurality of reading-out wirings being connected to the reading-out switch included in each of the M pixel portions $P_{1,n}$ to $P_{M,n}$ belonging to an n-th (an integer not less than 1 and not more than N) column in the photodetecting section, the reading-out wiring $L_{O,n}$ reading out a charge generated in the photodiode included in any one of the M pixel portions $P_{1,n}$ to $P_{M,n}$ via the associated reading-out switch;
a signal reading-out section being connected to each of the plurality of reading-out wirings $L_{O,1}$ to $L_{O,N}$, the signal reading-out section once holding voltage values according to an amount of charge inputted through the reading-out wiring $L_{O,n}$, and then sequentially outputting the held voltage values;
a plurality of row selecting wirings $L_{V,1}$ to $L_{V,M}$, a row selecting wiring $L_{V,m}$ of the plurality of row selecting wirings being connected to the reading-out switch included in each of the N pixel portions $P_{m,1}$ to $P_{m,N}$ belonging to an m-th row in the photodetecting section, the row selecting wiring $L_{V,m}$ transmitting a signal to control an opening and closing operation for reading-out switch to the reading-out switch included in each of the N pixel portions $P_{m,1}$ to $P_{m,N}$ belonging to an m-th row in the photodetecting section;
a row selecting section being connected to one end of each of the plurality of row selecting wirings $L_{V,1}$ to $L_{V,M}$, the row selecting section outputting a row selecting controlling signal to control an opening and closing operation of the reading-out switch included in each pixel portion $P_{m,n}$ of the photodetecting section to the row selecting wiring $L_{V,m}$, sequentially row by row, to close the reading-out switch in each pixel portion $P_{m,n}$, connected by the row selecting wiring, and thereby outputting a charge generated in the photodiode included in each pixel portion $P_{m,n}$ to the reading-out wiring $L_{O,n}$;
an overflow preventing section being connected to the other end of each of the plurality of row selecting wirings $L_{V,1}$ to $L_{V,M}$, the overflow preventing section outputting an overflow preventing signal to control an opening and closing operation of the reading-out switch included in each pixel portion $P_{m,n}$ of the photodetecting section to the row selecting wiring $L_{V,m}$ to close the reading-out switch in each pixel portion $P_{m,n}$ connected by the row selecting wiring, and thereby preventing a charge generated in the photodiode included in each pixel portion $P_{m,n}$ from overflowing outside the pixel portion; and a controlling section for individually controlling operations of the row selecting section and the overflow preventing section, the controlling section controlling the overflow preventing section such that the overflow preventing section, when any one of the plurality of row selecting wirings $L_{V,1}$ to $L_{V,M}$ is disconnected, selectively outputs the overflow preventing signal to the disconnected row selecting wiring, while not outputting the overflow preventing signal to the remaining row selecting wirings except for the disconnected row selecting wiring.

2. A solid-state imaging device according to claim 1, wherein the overflow preventing section outputs the overflow preventing signal to the disconnected row selecting wiring at the same timing as that of outputting the row selecting controlling signal from the row selecting section.

3. A solid-state imaging device according to claim 1, wherein detection of the disconnected row selecting wiring is completed prior to operation of the controlling section.

4. An X-ray CT apparatus, comprising:
an X-ray output section that outputs X-rays toward a subject;
a solid-state imaging device according to claim 1 that receives and images X-rays having been outputted from the X-ray output section and reached through the subject;
moving means for moving the X-ray output section and the solid-state imaging device relative to the subject; and
an image analyzing section inputting frame data to be outputted from the solid-state imaging device, and generating a tomographic image of the subject based on the frame data.

5. A solid-state imaging device, comprising:
a photodetecting section having M (an integer not less than 2)×N (an integer not less than 2) pixel portions $P_{1,1}$ to $P_{M,N}$ two-dimensionally arrayed so as to form a matrix of M rows and N columns, each of the pixel portions $P_{1,1}$ to $P_{M,N}$ including a photodiode that generates charge of an amount according to an incident light intensity, and a reading-out switch connected to the photodiode;
a plurality of reading-out wirings $L_{O,1}$ to $L_{O,N}$, a reading-out wiring $L_{O,n}$ of the plurality of reading-out wirings being connected to the reading-out switch included in each of the M pixel portions $P_{1,n}$ to $P_{M,n}$ belonging to an n-th (an integer not less than 1 and not more than N) column in the photodetecting section, the reading-out wiring $L_{O,n}$ reading out a charge generated in the photodiode included in any one of the M pixel portions $P_{1,n}$ to $P_{M,n}$ via the associated reading-out switch;
a signal reading-out section being connected to each of the plurality of reading-out wirings $L_{O,1}$ to $L_{O,N}$, the signal reading-out section once holding voltage values according to an amount of charge inputted through the reading-out wiring $L_{O,n}$, and then sequentially outputting the held voltage values;
a plurality of row selecting wirings $L_{V,1}$ to $L_{V,M}$, a row selecting wiring $L_{V,m}$ of the plurality of row selecting wirings being connected to the reading-out switch included in each of the N pixel portions $P_{m,1}$ to $P_{m,N}$ belonging to an m-th row in the photodetecting section, the row selecting wiring $L_{V,m}$ transmitting a signal to control an opening and closing operation for reading-out switch to the reading-out switch included in each of the N pixel portions $P_{m,1}$ to $P_{m,N}$ belonging to an m-th row in the photodetecting section;

a row selecting section being connected to one end of each of the plurality of row selecting wirings $L_{V,1}$ to $L_{V,M}$, the row selecting section outputting a row selecting controlling signal to control an opening and closing operation of the reading-out switch included in each pixel portion $P_{m,n}$ of the photodetecting section to the row selecting wiring $L_{V,m}$, sequentially row by row, to close the reading-out switch in each pixel portion $P_{m,n}$ connected by the row selecting wiring, and thereby outputting a charge generated in the photodiode included in each pixel portion $P_{m,n}$ to the reading-out wiring $L_{O,n}$;

an overflow preventing section being connected to the other end of each of the plurality of row selecting wirings $L_{V,1}$ to $L_{V,M}$, the overflow preventing section outputting an overflow preventing signal to control an opening and closing operation of the reading-out switch included in each pixel portion $P_{m,n}$ of the photodetecting section to the row selecting wiring $L_{V,m}$ to close the reading-out switch in each pixel portion $P_{m,n}$ connected by the row selecting wiring, and thereby preventing a charge generated in the photodiode included in each pixel portion $P_{m,n}$ from overflowing outside the pixel portion; and a controlling section for individually controlling operations of the row selecting section and the overflow preventing section, the controlling section controlling the overflow preventing section such that the overflow preventing section, when any one of the plurality of row selecting wirings $L_{V,1}$ to $L_{V,M}$ is disconnected, selectively outputs the overflow preventing signal to each of the disconnected row selecting wiring and row selecting wirings neighboring the disconnected row selecting wiring, while not outputting the overflow preventing signal to the remaining row selecting wirings except for the disconnected row selecting wiring and the row selecting wirings neighboring the disconnected row selecting wiring.

6. A solid-state imaging device according to claim 5, wherein the overflow preventing section outputs the overflow preventing signal to the disconnected row selecting wiring and the row selecting wirings neighboring the disconnected row selecting wiring at the same timing as that of outputting the row selecting controlling signal.

7. A solid-state imaging device according to claim 5, wherein detection of the disconnected row selecting wiring is completed prior to operation of the controlling section.

8. An X-ray CT apparatus, comprising:
an X-ray output section that outputs X-rays toward a subject;
a solid-state imaging device according to claim 5 that receives and images X-rays having been outputted from the X-ray output section and reached through the subject;
moving means for moving the X-ray output section and the solid-state imaging device relative to the subject; and
an image analyzing section inputting frame data to be outputted from the solid-state imaging device, and generating a tomographic image of the subject based on the frame data.

* * * * *

UNITED STATES PATENT AND TRADEMARK OFFICE
CERTIFICATE OF CORRECTION

PATENT NO.       : 8,483,359 B2                                     Page 1 of 1
APPLICATION NO.  : 12/864736
DATED            : July 9, 2013
INVENTOR(S)      : Fujita et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 196 days.

Signed and Sealed this

Eighth Day of September, 2015

Michelle K. Lee
*Director of the United States Patent and Trademark Office*